INVENTORS
BARTHOLOMEW P. MEDVECKY
AVTAR S. OBERAI
ALAN PLATT

BY Wolmar J. Stoffel
ATTORNEY

United States Patent Office 3,676,231

Patented July 11, 1972

3,676,231
METHOD FOR PRODUCING HIGH PERFORMANCE SEMICONDUCTOR DEVICE

Bartholomew P. Medvecky, Poughkeepsie, Avtar S. Oberai, Wappingers Falls, and Alan Platt, La Grangeville, N.Y., assignors to International Business Machines Corporation, Armonk, N.Y.

Filed Feb. 20, 1970, Ser. No. 12,977
Int. Cl. H01l 7/44
U.S. Cl. 148—188 6 Claims

ABSTRACT OF THE DISCLOSURE

A method for producing a diffused boron region in a silicon semiconductor having an impurity profile characterized as a step function and having a surface impurity concentration less than the solid solubility of boron in silicon wherein the body is exposed to a gaseous mixture of $O_2$, and $BBr_3$, and an inert carrier gas at an elevated temperature which forms a glassy boron rich layer, and subsequently heating the resultant body in an oxidizing environment, or a combination oxidizing and non-oxidizing environments, to increase the depth of the diffused region and simultaneously reduce the surface concentration producing a profile having a step function configuration.

BACKGROUND OF THE INVENTION

(1) Cross-references

IBM docket entitled "High Performance Semiconductor Device" by Ghosh et al., filed Oct. 7, 1968, Ser. No. 765,327, and now abandoned.

IBM docket entitled "Method of Forming Shallow Junction Semiconductor Devices" by Joseph J. Chang et al., filed Oct. 7, 1968, Ser. No. 765,328.

(2) Field of the invention

This invention relates to a semiconductor structure and a method for forming a shallow junction semiconductor device that has particularly high electrical performance, and more particularly has a base region with a profile approaching a step function.

(3) Description of the prior art

High performance transistors, particularly transistors utilized in computer applications, require a high frequency response combined with reasonable gain. In order to obtain these operating characteristics it is well established that the transistor structure must have (1) a narrow base width, (2) a high integrated base doping, (3) low neutral emitter capacitance, and (4) low base resistance. In transistor fabrication an attempt to obtain these objectives frequently amounts to a compromise. While the base of the transistor must be relatively narrow, it must not be so narrow that "punch-through" occurs. Emitter capacitance, and base resistance are directly influenced by the distribution of the impurity within the base region, i.e. the type of profile. While increasing the impurity concentration in the base reduces the base resistance, there is a practical limit since the possibility of tunneling at the emitter base junction exists at high impurity concentrations which reduces the gain of the transistor. In order to obtain high integrated base doping and low emitter capacitance, the most desirable profile in a transistor device in a "square" profile. A square profile is basically a uniform impurity concentration with depth in a semiconductor body. Another advantage of a square profile in that the "Kirk" effect is minimized thus increasing the frequency response of the device.

Diffusion techniques used commonly in silicon for base diffusion planar technology result inherently in a profile which resembles the complementary error function distribution curve, that is having a high surface impurity concentration with a decreasing impurity concentration inwardly from the surface. In a transistor this type of profile is less desirable than an idealized square profile, also referred to as a step profile, for the reasons elaborated on previously.

SUMMARY OF THE INVENTION

An object of this invention is to provide a method for producing in a semiconductor body a boron region having essentially a step profile.

Another object of this invention is to provide a method for diffusing a base region in a transistor such that a narrow base with high integrated doping is obtained.

Still another object of this invention is to provide a method for producing a transistor having a high frequency response and a high gain.

These and other objects are accomplished by the method of the invention which provides for producing in a monocrystalline silicon semiconductor body a diffused boron base region having an impurity profile characterized as a step function with a surface impurity concentration less than the solid solubility of boron in silicon. In the process a gaseous mixture of $O_2$, $BBr_3$, and an inlet carrier gas is flowed over a heated silicon body which results in the formation of a glassy boron rich layer at the surface and a shallow boron diffused region. The resultant body is then heated in an oxidizing environment or an oxidizing environment followed by an inert or a related diffusion step, for a time sufficient to increase the depth of the diffused region while simultaneously reducing the surface concentration of the resultant region. The resultant profile can be characterized as a step function, as contrasted to a profile resembling the error function distribution curve when diffusions are carried out by the process as known to the prior art.

BRIEF DESCRIPTION OF THE DRAWINGS

The foregoing and other objects, features and advantages of the invention will be apparent from the following, more particular description of the preferred embodiments of the invention, as illustrated in the accompanying drawing, wherein.

DESCRIPTION OF PREFERRED EMBODIMENTS

In modern semiconductor design the objective is to increase the speed of operation of the device consistent with current gain and voltage breakdown considerations. The speed or frequency response of the transistor can be increased by decreasing the dimensions of the device thereby bringing about a reduction in the parasitic capacitances of the device. Decreasing the area of the various junctions in the transistor decreases the capacitance between the respective elements. However, decreasing the size of the elements, in particular the emitter regions of the transistor, results inherently in an increased current density through the transistor structure. In order to achieve the higher current densities and higher gain-bandwidth characteristics, the impurity profile of the transistor has to be adjusted such that the impurity gradient at the intrinsic emitter base junction is as high as possible and the base width is kept as narrow as possible. The base width of the transistor can be reduced only to a level such that an adequate impurity level is present in the intrinsic base to sustain a required emitter to collector punch through voltage. Therefore, a very desirable impurity profile for the base diffusion would be such as to provide (i) a high gradient at the intrinsic emitter base junction and (ii) a high amount of integrated base doping to sustain a required emitter to base punch through voltage in a very narrow base width.

Figure 1:
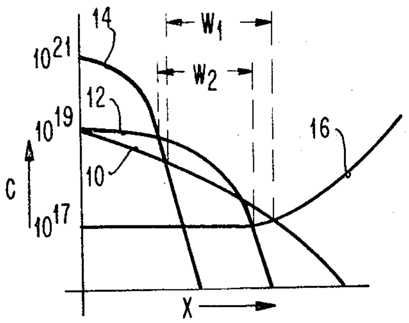
FIG. 1 is an impurity profile graph of a transistor depicting for comparison both the square base profile produced by the method of the invention and a conventional base profile produced by known diffusion methods.

Referring now to FIG. 1 of the drawing, curve 10 depicts a typical base profile in a transistor obtained by diffusing boron into a silicon wafer. The base width of such a device is indicated as $W_2$. Base profile 12 depicts the type of profile obtained by the method of the subject invention. As indicated, profile 12 approaches a step function shape. The base width is indicated by $W_2$, which when compared to base width $W_1$ is considerably narrower. This is particularly significant when one considers that the total amount of doping material in the base is approximately the same in both instances even though the base indicated by profile 12 has a much narrower width. The amount of doping is roughly indicated by the area under each of the respective profile curves. A second advantage of step profile 12 over generally obtained profile 10 is that of increased impurity gradient at the intrinsic emitter base junction, as can be seen from an examination of FIG. 1.

The transistor profile is completed by the emitter profile 14 and the collector profile 16.

Figure 2:
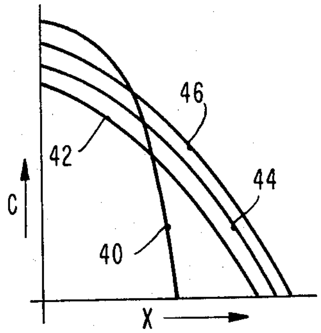
FIGS. 2 and 3 are graphs depicting various combinations of base and emitter profiles used to explain the importance of the invention and contrast same from the prior art.

Referring now to FIG. 2 of the drawing there is depicted an emitter profile curve 40 and a base profile curve 42 having the shape of an error function distribution curve which characterize impurity distributions in diffused regions produced by techniques known to the prior art. In redesigning a transistor to increase its current carrying capacity it is recognized that the impurity gradient across the intrinsic base emitter junction must be increased. This impurity gradient can be increased by simply introducing the base impurity into the device at higher concentrations, indicated by curve 44 and 46. Impurity distribution indicated by curves 44 and 46 can be produced by increasing the concentration of the impurity available for diffusing, as for example increasing the impurity vapor pressure in a capsule diffusion. This has the effect of materially increasing the impurity gradient in the base region. However, the impurity gradient is also increased along the base emitter junction along the sidewalls of the emitter particularly at the surface. This has the very bad effect of reducing the sidewall voltage breakdown. When the concept is carried to its extreme, the voltage breakdown will approach 0 thereby resulting in an inoperative transistor. Thus following the suggestion shown in FIG. 2 one might obtain a very favorable impurity gradient along the bottom surface of the emitter which would be of limited value because the voltage breakdown along the sidewalls of the diffused emitter is decreased.

Figure 3:
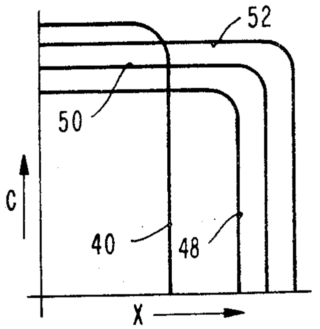

FIG. 3 is the profile of a base in a transistor having the square configuration suggested by this invention. Curve 40 depicts the emitter profile which preferably is a step type function produced in accordance with the teaching set forth in commonly assigned application Ser. No. 765,327. Base profile 48, which approaches a step type curve makes possible an impurity gradient at the intrinsic base emitter junction which is relatively high yet does not produce an impurity gradient at the sidewalls of the emitter base that is as high as the structure characterized in FIG. 2. The impurity gradient can be further increased in the same manner shown in FIG. 2 by increasing the surface concentration as depicted by curves 50 and 52. Comparing these profiles in FIG. 2 and FIG. 3 it is believed clear that a higher impurity gradient can be obtained at the intrinsic base emitter junction with the square profile shown in FIG. 3 without decreasing the voltage breakdown across the sidewalls of the emitter by the same margin as would be the case with structure of FIG. 2.

Figures 4, 5, 7:
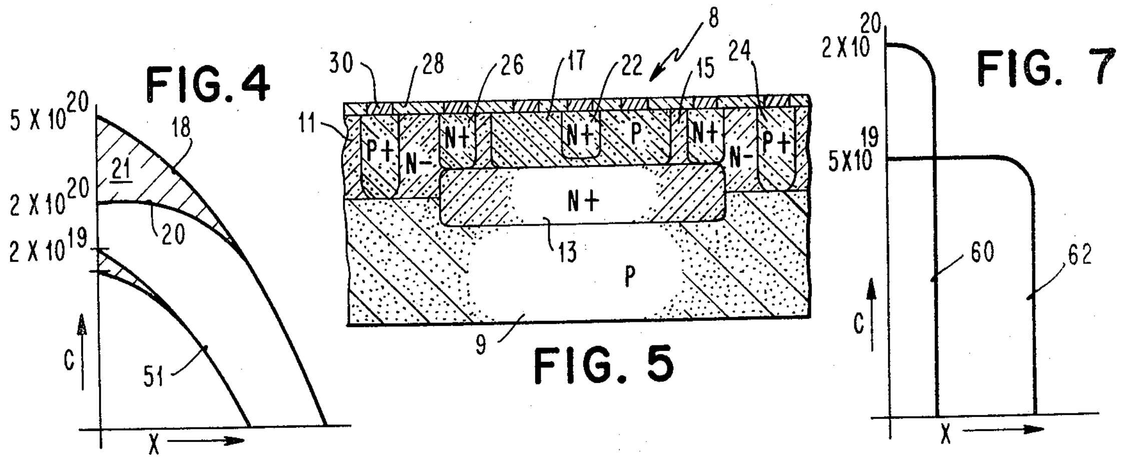
FIG. 4 is an impurity profile graph depicting two types of boron diffused regions in a silicon body illustrating the limitations of known diffusion techniques.
FIG. 5 is a cross-section view of a typical transistor device.
FIG. 7 is an impurity profile graph depicting the nature of the impurity concentration during various stages of the invention.

Referring now to FIG. 4 of the drawing, there is depicted two profiles for boron diffused regions in a monocrystalline silicon semiconductor body. Curve 18 is a profile depicting the impurity concentration physically present when diffusion conditions produce a surface boron concentration in excess of the electrically active impurity at room temperature. Curve 18 can be determined by chemical analysis. Curve 20 indicates the concentration of electrically active impurity at room temperature as might be determined by a spreading resistance probe or similar technique which measures only the amount of impurity which takes part in classical transistor operations. The shaded area 21 depicts the impurity material physically present in the diffused region but which does not participate in the function of the transistor. Note that curve corresponds to a step function, i.e., a squarish profile but the surface impurity concentration and also the concentration beneath the surface is of the order of $2\times10^{20}$ atoms/cc. When boron is diffused into a silicon semiconductor body, such that conditions result in a surface concentration below the solid solubility limit of boron in silicon at room temperature, the resultant profile 51 corresponds to the error distribution profile departing signficantly from the desirable squire profile 12 shown in FIG. 1. Thus boron profiles in the silicon produced by methods known to the prior art, having a surface concentration between $7\times10^{18}$ and $5\times10^{19}$, as dictated by design considerations are produced corresponding to a complementary error function distribution curve. Impurity profiles of boron in silicon having a desirable step function type profile have surface impurity concentration above the desired rangeand are therefore of limited applicability.

Referring now to the figures of the drawing and FIG. 5 in particular there is disclosed a cross-sectional view of a typical planar microminiturized integrated circuit device 8. Device 8 has a substrate wafer 9 lightly doped with a P type impurity supporting an overlying epitaxial layer 11 of N type material which includes a subcollector region 13, a collector region of 15, a base region 17, an emitter region 22, isolation diffusions 24, and collector contact regions 26. Disposed on the top surface is an insulating layer 28 having apertures disposed therein and a conductive metallurgy network consisting of conductive metal strips 30 making contact to various regions of the device and associated devices to form a circuit.

The general objective of the invention is a method for producing a boron doped region suitable for use as a base in a transistor having an impurity distribution within the region characterized as a square profile with a surface impurity concentration less than the solid solubility of boron in silicon at room temperature that is less than $5\times10^{20}$ atoms/cc.

The process included two separate phases namely a first phase in which the wafer is exposed to $BBR_3$ and $O_2$ wherein a boron enriched glassy layer is formed over the surface of the device and wherein a shallow diffusion is made to the semiconductor body. The impurity distribution of the shallow diffusion made during the first diffusion step is indicated in FIG. 7 by profile 60. The surface concentration can be as high as the solid solubility limit of boron in silicon at the diffusion temperature. The depth of penetration of the impurity into the semiconductor will vary and will generally be in the range of 10 to 20 microinches for a high speed transistor but could be lower or higher. The diffusion temperature can be of any suitable temperature and will normally be in the range of 850 to 1200° C. The gaseous mixture will include an inert carrier gas, typically argon or nitrogen, combined with suitable amounts of $BBr_3$ and $O_2$. The $BBr_3$ is present preferably in an amount in the range of .5 to 5%, more preferably .5 to 1.5%, and oxygen in an amount in the range of 1 to 10%, more preferably 1 to 27. Most preferably the wafers in an open tube diffusion apparatus of the type shown in FIG. 6 will be subjected to a short pre-heat time, a subsequent exposure to the mixture of inert gas, $BBr_3$, and oxygen, and finally exposure to the only combination of the inert gas and oxygen.

The second phase of the method is a reoxidation and drive-in step wherein the wafers are subjected to elevated temperatures normally in the range of 900 to 1200° C. in an oxidizing atmosphere. The oxidizing atmosphere can be oxygen, steam, a combination oxygen and steam, or other suitable oxidizing environment. Preferably the wafers during the reoxidation and drive-in step are subjected to a pre-heat phase, an oxidizing phase, and subsequently a drive-in phase where the amount of oxidizing element in the atmosphere is reduced. During the reoxidation and drive-in stage the original impurity distribution of the diffusion, indicated in FIG. 7 by profile 60, is changed so that the base impurity profile within the device can be characterized by profile 62. The depth of the diffusion is materially increased, normally in the range of 100 to 1000% and the surface concentration is reduced, preferably in the range of $5\times10^{18}$ to $1\times10^{20}$, or there about. The reoxidation and drive-in step could also conveniently comprise of a very short oxidation cycle of 2 to 10 minutes in oxidizing atmosphere at temperatures in the range 900–970° C. followed by a drive-in step which could be the emitter diffusion step. The diffusion may be at any suitable temperature and time, for example 1000° C. for 150 minutes.

The time and temperature of the oxidation and drive-in step one suitable adjusted along with the initial deposition cycle to obtain the required base surface concentration and the desired junction depths for the various diffusions.

Figure 6:
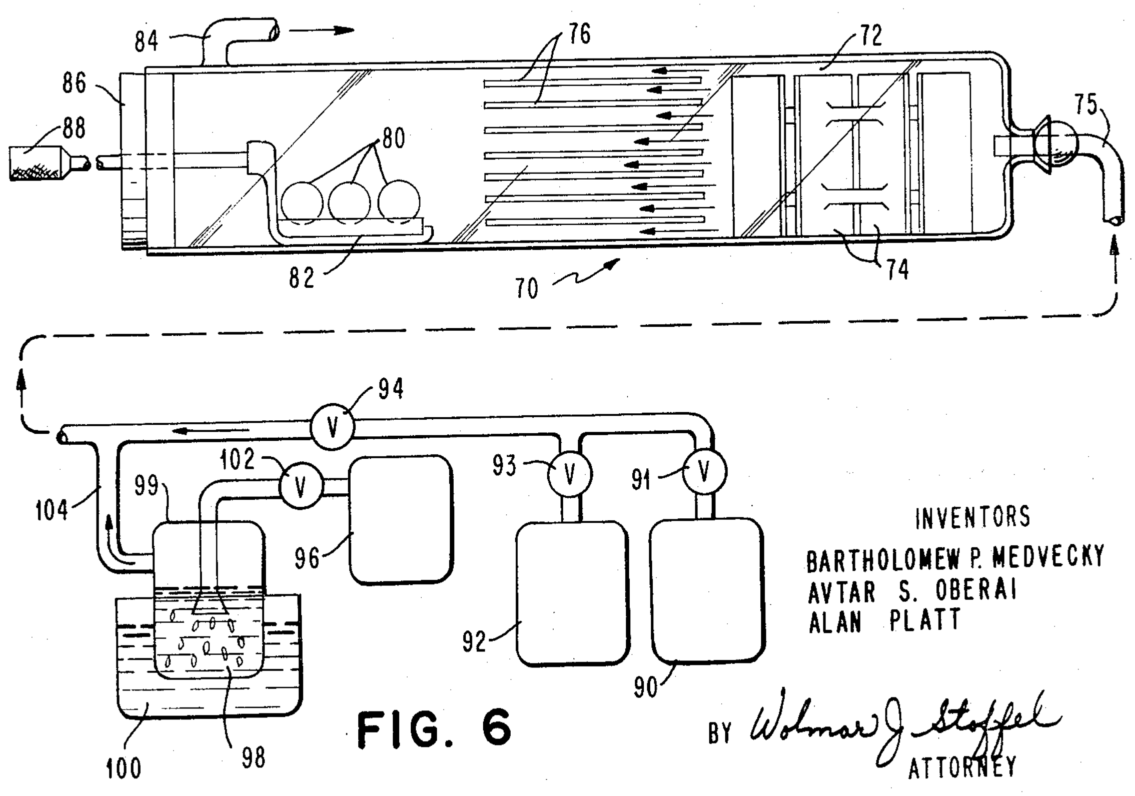
FIG. 6 is a schematic view of the apparatus used to carry out the process of the invention.

In FIG. 6 there is depicted open tube diffusion apparatus 70. Apparatus 70 includes a tube 72 in which are mounted a first series of vertically extending baffles 74, preferably arranged in a V configuration, and a second set of horizontal baffles 76 arranged in parallel. The function of baffles 74 is to intimately mix the various gases introduced through inlet 75, while baffles 76 smooth the flow so that the gas flow is essentially laminar over the wafers 80 held in boat 82. An exhaust 84 releases the gaseous mixture within tube 72. The boat 82 is joined to a plug 86 provided with a suitable handle 88. Gases are introduced through inlets 75 from sources 90 and 92 which are typically argon and $O_2$, respectively. Valves 91 and 93 control the relative amounts of gas release from sources 90 and 92. The $BBr_3$ is introduced into capsule 72 by passing or bubbling an inert gas from source 96 over or through the liquid source $BBr_3$ 98 in flask 99. The temperature of the $BBr_3$ is maintained at 0° C. by an ice bath 100 and the flow of the inert gas from source 96 is controlled by valve 102. The inert gas from source 96 flowing across or through the $BBr_3$ 98 vaporized a portion thereof and the mixture is thereby transported to the open tube diffusion 72 through conduit 104.

The following examples set forth preferred embodiments of the method of the invention and are not to limit the invention.

EXAMPLE I

A wafer having a resistivity of 1 ohm per square with a <100> crystal orientation was supported in an open tube apparatus similar to that described in FIG. 6. The temperature within the tube 72 was maintained at 1000° C. The wafer was preheated for five minutes in an environment of pure argon. A mixture of 1% $BBr_3$ and 2% oxygen on an argon carrier gas was then admitted to the tube for a period of 5 minutes. Finally the $BBr_3$ was turned off and the wafer exposed at the same temperature to a mixture of only argon and oxygen at the same flow rate. The wafer was then removed and cooled to room temperature and inspected. A boron rich glass having a thickness of approximately 500 angstroms was deposited on the top surface thereof. The depth of penetration of the diffused region was approximately 10 microinches and the resistivity in the diffused region was measured at 40 ohms per square. The wafer was then subjected to the second oxidation and drive-in phase wherein the wafer was put into a furnace maintained at 970° C. and preheated in an oxygen atmosphere for 5 minutes, followed by exposure to a mixture of oxygen and steam for 40 minutes and finally 5 minutes only to oxygen. Upon cooling the wafer was examined and it was noted that a composite layer of $B_2O_3$ and over lying $SiO_2$ layer were formed having an overall thickness of approximately 2400 A. The depth of the diffused region was then measured and noted to be 25.1 microinches with the resistivity being 173 ohms per square. The wafer was then analyzed using an anodic oxidation technique which indicated a step profile.

EXAMPLE II

A second wafer was subjected to the same initial phase for depositing the boron enriched glassy layer and the diffusion but the reoxidation and drive-in stage was altered such that the wafer was exposed for 50 minutes to an environment of pure oxygen. The composite layer of $B_2O_3+SiO_2$ was 434 A. in thickness; the depth of penetration was 23.5 microns and the resultant resistivity of the diffused region was 107 ohms per square. Examination of resultant profile indicated that it was a step type profile.

Comparing the wafer produced in Example II with that produced in Example I it was noted that the resultant composite layer was significantly thinner, the depth of diffusion was smaller and the resistivity of the diffused region was less. This indicated that a thinner composite layer formed during the reoxidation and drive-in stage allowed significant out diffusion of the impurity within the initially formed region.

EXAMPLE III

A wafer was again placed in the open tube apparatus maintained at a temperature of 1000° C., and subjected to a five minute preheat stage in pure oxygen, a 90 minute glass formation stage wherein the mixture included argon, oxygen and $BBr_3$, and a third stage lasting 5 minutes wherein the environment consisted only of argon and oxygen. The wafer was cooled and the boron enriched glassy layer measured at 800 A. in thickness. The diffused region had a resistivity of 60 ohms per square. The wafer was then heated to a temperature of 1050° C. for 100 minutes in a pure oxygen atmosphere, a second 30 minutes in an oxygen plus steam environment and a final 10 minutes in an oxygen atmosphere. The depth of the diffusion was then measured and found to be 93 microinches and the conductivity of the diffused region noted to be 52.0 ohms per square. The profile analysis indicated that a step type profile was formed.

EXAMPLE IV

An insulating mask of $SiO_2$ was grown on the upper surface of a substrate wafer of $P-$ conductivity having a resistivity of 6–15 ohm cm. This was achieved by oxidizing the wafer at 970° C. for 60 minutes in steam so as to form approximately 0.5 micron of silicon dioxide on top surface.

An opening in the mask was formed by using conventional techniques, to define a sub-collector region. Arsenic was employed as the $N+$ impurity for diffusion to form the sub-collector region. The diffusion was made at a temperature of 1105° C. to produce a region with a surface concentration of $10^{21}$ atoms/cm.$^3$ having a depth of approximately 1.2 microns. After the diffusion, the wafer surface was reoxidized at 970° C. to close the opening and form a step for subsequent alignment purposes.

After removal of the oxide layer, an epitaxial layer of N− conductivity was grown on the substrate of the semiconductor structure. The epitaxial layer was fabricated to have a surface concentration in the order of $10^{15}$ atoms/cm.$^3$. This was accomplished by means of the halide reduction. The epitaxial layer, which had a thickness of about 2 microns, was fabricated to have a surface concentration in the order of $10^{15}$ atoms/cm.$^3$ by employing the hydrogen reduction of $SiCl_4$ at a temperature of 1150° C. for 18 minutes with a growth rate of 0.11 micron/minute. Thereafter, the substrate was oxidized at 970° C. to form the masking layer of approximately 0.5 micron of silicon dioxide.

An appropriate opening was then formed in the oxide layer for forming an isolation region corresponding to region 24 in FIG. 5. An isolation region of P+ conductivity was formed in the epitaxial layer by diffusing boron through the opening in the insulating mask at a temperature of 1105° C. The diffusion was controlled so that the surface concentration of the region was $4\times10^{20}$ atoms/cm.$^3$ with a depth of 2.0 microns. After completion of diffusion of the region a reoxidation at 970° C. was accomplished.

The opening in the insulating mask for the isolation diffusion is such that the diffusion region produced was rectilinear in form. In practice each of the device sites in the substrate will have one of the isolation regions, although only one device is shown in FIG. 5. The diffusion step was carried out so that the isolation diffusion region penetrates inwardly to a depth to extend to the upper surface of the substrate wafer at the completion of all of the processing steps. As is well known to one versed in the state of the art, this constitutes an isolation diffusion surrounding any device to be isolated from another.

After the diffused region had been diffused into the layer and reoxidation at 970° had occurred, an N+ collector reach through region corresponding to 16 was formed by diffusion of an N type dopant through another opening in the insulating mask into the epitaxial layer so as to reach through or link with the N+ sub-collector region. Out diffusion of impurities from the sub-collector region into the epitaxial layer occurred during growth of the epitaxial layer and during diffusion of the regions corresponding to 24 and 26. This resulted in merging the reach through diffused region and the N+ sub-collector region.

The reach through diffused region had a depth of about 0.8 micron and a surface concentration of $4\times10^{19}$ atoms/cm.$^3$, which was achieved by diffusion of phosphorous from a powder source at a temperature of 1050° C. A 60 minute $O_2$ and steam oxidation step at 970° C. closes these openings and provides oxide layer for subsequent diffusion openings.

A diffusion step was next performed in which the base region is formed through an opening in the $SiO_2$ layer with a $BBr_3$ diffusion. The $BBr_3$ diffusion was carried out at 950° C.

In the diffusion the wafer was exposed to (1) pure argon for 5 minutes, (2) a gaseous mixture of 1% $BBr_3$, 1½% $O_2$ and the balance argon for 10 minutes, and (3) a mixture of 1½% $O_2$ and the balance argon for 5 minutes. This deposition cycle was followed by an oxidation cycle at 970° C.

The oxidation cycle consisted of exposing the wafer to (1) pure $O_2$ for 6 minutes, and (2) a mixture of approximately 90% steam and the balance $O_2$ for 2 minutes. At this stage base junction depth is 0.35 micron and 900 A. of silicon dioxide containing $B_2O_3$ is present in the base region.

After the formation of the base region, an emitter N+ emitter region was formed in the base region by another diffusion. The formation of the emitter region was achieved by the diffusion of arsenic from a powder source at a temperature of 1000° C. to produce a surface concentration of $10^{21}$ atoms/cm.$^3$ with a junction depth of approximately 0.5 micron. The emitter diffusion results in a further drive-in of the already diffused base region such that the base junction at the end of the emitter diffusion step was approximately 0.65 micron thereby providing a metallurgical base width of 0.15 micron.

A conductive metallurgy network of conductive stripes making ohmic contact to various regions of the device and associated devices was deposited on the $SiO_2$ to form a circuit.

While the invention has been particularly shown and described with reference to preferred embodiments thereof, it will be understood by those skilled in the art that the foregoing and other changes in form and details may be made without departing from the spirit or scope of the invention.

What is claimed is:

1. A method for producing in a monocrystalline silicon semiconductor body a diffused boron region having an impurity profile characterized as a step-function and having a surface impurity concentration in the range of $5\times10^{18}$ to $1\times10^{20}$ atoms per cc. comprising:

flowing a gaseous mixture of $O_2$, $BBr_3$, and an inert carrier gas over the silicon body heated to a temperature in the range of 850° C. to 1200° C., resulting in the formation of a glassy boron rich layer on the surface of said body and a shallow boron diffused region, heating the resultant semiconductor body at a temperature in the range of 900° C. to 1200° C., for a time sufficient to increase the depth of the diffused region by 100 to 1000% and reducing the surface concentration of the resultant region, at least a portion of the time of said heating being done in an oxidizing environment which includes at least a mixture of $O_2$ and steam.

2. The method of claim 1 wherein said gaseous mixture contains from 1 to 2% $O_2$ and .5 to 1.5% $BBr_3$.

3. The method of claim 1 wherein the formation of the glassy boron rich layer by flowing the gaseous mixture is preceded by a heating step in which the wafer is preheated in an atmosphere of inert gas.

4. The method of claim 1 wherein the depth of the diffused region is increased by a combination of initially heating in an oxidizing environment and by heating during subsequent process steps.

5. The method of claim 1 wherein the device is heating in the oxidizing environment to a temperature on the order of 1000° C.

6. The method of claim 1 wherein time of heating to increase the depth of the diffusion is adjusted to increase the depth by 100 to 300%.

References Cited

UNITED STATES PATENTS

| | | | |
|---|---|---|---|
| 3,066,052 | 11/1962 | Howard | 148—1.5 |
| 3,542,609 | 11/1970 | Bohne et al. | 148—189 X |
| 3,484,314 | 12/1969 | Bohne et al. | 148—188 |
| 3,404,451 | 10/1968 | So | 29—577 |
| 2,802,760 | 8/1957 | Derick et al. | 148—189 |
| 3,164,501 | 1/1965 | Beale et al. | 148—189 |
| 3,540,952 | 11/1970 | Ehle | 148—189 |
| 3,486,951 | 12/1969 | Norby | 148—189 X |

OTHER REFERENCES

Integrated Circuits, McGraw-Hill Book Co., New York, 1965, pp. 293–296.

L. DEWAYNE RUTLEDGE, Primary Examiner

G. K. WHITE, Assistant Examiner

U.S. Cl. X.R.

148—189